(12) United States Patent
Dong et al.

(10) Patent No.: US 12,490,633 B2
(45) Date of Patent: Dec. 2, 2025

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xiangdan Dong, Beijing (CN); Rong Wang, Beijing (CN); Mengmeng Du, Beijing (CN); Changlong Yuan, Beijing (CN); Fan He, Beijing (CN); Donghui Tian, Beijing (CN)

(73) Assignees: CHENGDU BOE OPTOELECTRONICS TECHNOLOGY CO., LTD., Chengdu (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 17/997,869

(22) PCT Filed: Nov. 25, 2021

(86) PCT No.: PCT/CN2021/133237
§ 371 (c)(1),
(2) Date: Nov. 3, 2022

(87) PCT Pub. No.: WO2023/092402
PCT Pub. Date: Jun. 1, 2023

(65) Prior Publication Data
US 2024/0260398 A1    Aug. 1, 2024

(51) Int. Cl.
*H10K 59/80* (2023.01)
*H10K 59/131* (2023.01)

(52) U.S. Cl.
CPC ......... *H10K 59/873* (2023.02); *H10K 59/131* (2023.02)

(58) Field of Classification Search
CPC .... H10K 59/873; H10K 59/131; H10K 59/00; H10K 59/124
See application file for complete search history.

(56) References Cited

U.S. PATENT DOCUMENTS

| | | | |
|---|---|---|---|
| 11,316,004 | B2 | 4/2022 | Kim et al. |
| 2021/0143368 | A1 | 5/2021 | Wang et al. |

(Continued)

FOREIGN PATENT DOCUMENTS

| | | | |
|---|---|---|---|
| CN | 107689425 | A | 2/2018 |
| CN | 109742103 | A | 5/2019 |

(Continued)

*Primary Examiner* — Elmito Breval
(74) *Attorney, Agent, or Firm* — LEASON ELLIS LLP

(57) ABSTRACT

A display panel includes: a display region; a peripheral region surrounding the display region; a base substrate; a first signal line, located on the base substrate, including an electrode structure located in the peripheral region, and an edge of the electrode structure away from the display region having a stepped shape; and a covering portion, covering the edge of the electrode structure away from the display region. The display panel adopts the covering portion to cover the edge of the electrode structure away from the display region, so as to protect the edge of the electrode structure, and to avoid the phenomenon of electrochemical corrosion of the edge of the electrode structure, the edge of the electrode structure away from the display region is designed to have a stepped shape, thereby prolonging a path for water vapor to enter the display region, and improving reliability of the display panel.

20 Claims, 6 Drawing Sheets

(56) References Cited

U.S. PATENT DOCUMENTS

2021/0225986 A1 7/2021 Han
2021/0336216 A1 10/2021 Liu et al.

FOREIGN PATENT DOCUMENTS

| CN | 110148617 A | | 8/2019 |
|----|-------------|---|--------|
| CN | 110635067 A | | 12/2019 |
| CN | 112133726 A | | 12/2020 |
| KR | 20200004932 A | * | 1/2020 |
| WO | 2021205635 A1 | | 10/2021 |

* cited by examiner

DISPLAY PANEL AND DISPLAY DEVICE

This application is a U.S. National Phase Entry of International Application No. PCT/CN2021/133237 filed on Nov. 25, 2021. The present application claims priority to and the benefit of the above-identified application and the above-identified application is incorporated by reference herein in its entirety.

TECHNICAL FIELD

At least one embodiment of the present disclosure relates to a display panel and a display device.

BACKGROUND

Organic light-emitting diode (OLED) display device is an organic electroluminescent display device, which has advantages of simplified manufacturing process, low cost, high luminous efficiency, easy formation of flexible structure, self-luminescence, all-solid state and high contrast ratio, etc. Therefore, the display technology utilizing the organic light-emitting diode has become an important display technology.

With continuous improvement of users' requirements for the quality of display devices, encapsulation technology has become more and more important. At present, in order to prevent a penetration of water and oxygen into the display device from a side of the display device, a hydrophobic barrier wall or a convex barrier wall are usually arranged between two inorganic encapsulation layers, so that water and oxygen cannot penetrate into an internal portion of the display device.

SUMMARY

At least one embodiment of the present disclosure provides a display panel. In the display panel, an edge of an electrode structure in a first signal line that is away from the display region is arranged to have a stepped shape, and is covered by a covering portion, so as to prolong a path for water vapor to enter the display region, and to improve reliability of the display panel.

At least one embodiment of the present disclosure provides a display panel, including: a display region: a peripheral region surrounding the display region: a base substrate; a first signal line, located on the base substrate, including an electrode structure located in the peripheral region, and an edge of the electrode structure away from the display region having a stepped shape; and a covering portion, covering the edge of the electrode structure away from the display region.

For example, in a display panel provided by at least one embodiment of the present disclosure, the first signal line further includes a conductive portion located in the peripheral region and arranged on the base substrate, the conductive portion and the electrode structure are electrically connected in the peripheral region, and the conductive portion is closer to the base substrate than the electrode structure.

For example, in a display panel provided by at least one embodiment of the present disclosure, the covering portion has a stepped shape.

For example, in a display panel provided by at least one embodiment of the present disclosure, at least a part of the covering portion has an integral structure.

For example, in a display panel provided by at least one embodiment of the present disclosure, an extension direction of at least a part of the covering portion is the same or approximately the same as an extension direction of the edge of the electrode structure away from the display region.

For example, in a display panel provided by at least one embodiment of the present disclosure, the electrode structure has a first edge close to the display region and a second edge away from the display region, and a middle portion of the second edge is recessed toward the first edge to form a middle notch.

For example, in a display panel provided by at least one embodiment of the present disclosure, the second edge has a stepped structure.

For example, in a display panel provided by at least one embodiment of the present disclosure, a direction from the first edge to the second edge is a first direction, a direction intersecting with the first direction is a second direction, and on a first side of the middle notch, a width of the electrode structure in the first direction gradually decreases along the second direction; on a second side of the middle notch, a width of the electrode structure in the first direction gradually increases along the second direction.

For example, in a display panel provided by at least one embodiment of the present disclosure, the stepped shape includes a first convex structure and a first concave structure which are connected with each other and arranged adjacent to each other.

For example, in a display panel provided by at least one embodiment of the present disclosure, the second edge has Z-shaped steps on both sides of the middle notch, respectively.

For example, in a display panel provided by at least one embodiment of the present disclosure, along the first direction, a size of the middle notch in the second direction increases sequentially.

For example, in a display panel provided by at least one embodiment of the present disclosure, the display panel further includes a second signal line, and at least a part of the second signal line is arranged in the middle notch.

For example, in a display panel provided by at least one embodiment of the present disclosure, the second signal line is configured to transmit a power supply signal of a pixel driving circuit.

For example, in a display panel provided by at least one embodiment of the present disclosure, the first signal line further includes an electrode connection portion located in the peripheral region and disposed between the conductive portion and the electrode structure, the electrode connection portion is in contact with the conductive portion and is in contact with the electrode structure.

For example, in a display panel provided by at least one embodiment of the present disclosure, an orthographic projection of the electrode connection portion on the base substrate overlaps with an orthographic projection of the electrode structure on the base substrate.

For example, in a display panel provided by at least one embodiment of the present disclosure, the orthographic projection of the electrode structure on the base substrate is located within the orthographic projection of the electrode connection portion on the base substrate.

For example, in a display panel provided by at least one embodiment of the present disclosure, an orthographic projection of the edge of the electrode connection portion on the base substrate at least partially overlaps with an orthographic projection of the covering portion on the base substrate.

For example, in a display panel provided by at least one embodiment of the present disclosure, the display panel is an organic light-emitting diode display panel, the organic light-emitting diode display panel includes a thin film transistor and an organic light-emitting diode, the thin film transistor includes a source-drain electrode layer, the organic light-emitting diode includes a first electrode, and a connection structure is provided between the source-drain electrode layer and the first electrode, the first electrode and the connection structure are electrically connected with the source-drain electrode layer, the electrode structure and the first electrode (anode) are arranged in the same layer, the conductive portion and the source-drain electrode layer are arranged in the same layer, and the electrode connection portion and the connection structure are arranged in the same layer.

For example, in a display panel provided by at least one embodiment of the present disclosure, a material of the electrode connection portion and a material of the conductive portion are same, and a material of the electrode connection portion and a material of the electrode structure are different.

For example, in a display panel provided by at least one embodiment of the present disclosure, the display panel further includes a plurality of block structures, materials of the plurality of block structures include an organic insulating material, and at least a part of the plurality of block structures forms the covering portion, at least two stepped structures are covered by different block structures.

For example, in a display panel provided by at least one embodiment of the present disclosure, the plurality of the block structures are located in the peripheral region, and are sequentially arranged along a direction from the peripheral region to the display region, and each of the block structures is arranged around the display region.

For example, in a display panel provided by at least one embodiment of the present disclosure, the block structure includes a block portion and a block dam, the block portion and the block dam are arranged sequentially along the first direction, and from a side close to the base substrate to a side away from the base substrate, a thickness of the block portion is smaller than a thickness of the block dam.

For example, in a display panel provided by at least one embodiment of the present disclosure, the block portion, a first part of the block dam, and the covering portion are arranged in the same layer and have an integral structure.

For example, in a display panel provided by at least one embodiment of the present disclosure, the block portion includes a first block portion, a second block portion, and a third block portion that are sequentially arranged along the first direction, and the block dam includes a first block dam and a second block dam that are arranged sequentially along the first direction.

For example, in a display panel provided by at least one embodiment of the present disclosure, along the first direction, a first distance D1 between the first block portion and the second block portion is substantially equal to a second distance D2 between the second block portion and the third block portion, and is smaller than a third distance D3 between the third block portion and the first block dam, a fourth distance D4 is between the first block dam and the second block dam.

For example, in a display panel provided by at least one embodiment of the present disclosure, a portion of the covering portion between the first block portion and the second block portion has a first step; a portion of the covering portion between the second block portion and the third block portion has a second step; and a portion of the covering portion between the third block portion and the first block dam has a third step.

For example, in a display panel provided by at least one embodiment of the present disclosure, in the second direction, a width of the first step is equal to or approximately equal to a width of the second step, and is equal to or approximately equal to a width of the third step.

For example, in a display panel provided by at least one embodiment of the present disclosure, from a side close to the base substrate to a side away from the base substrate, a thickness of the first block portion, a thickness of the second block portion, and a thickness of the third block portion are equal and each of which is a first thickness, the first block dam has a second thickness, the second block dam has a third thickness, and the first thickness, the second thickness, and the third thickness increases sequentially.

For example, in a display panel provided by at least one embodiment of the present disclosure, each of the first block portion, the second block portion, the third block portion, the first block dam, and the second block dam includes a first organic layer, and the first organic layers of the first block portion, the second block portion, the third block portion, the first block dam, and the second block dam are arranged in the same layer; each of the first block dam and the second block dam further includes a second organic layer arranged on a side of the first organic layer close to the base substrate, and the second organic layer of the first block dam and the second organic layer of the second block dam are arranged in the same layer; and the second block dam further includes a third organic layer arranged on a side of the second organic layer close to the base substrate.

For example, in a display panel provided by at least one embodiment of the present disclosure, the display panel further includes an encapsulation layer arranged on a side of the block portion and the block dam away from the base substrate, an orthographic projection of the encapsulation layer overlaps with an orthographic projection of at least a part of the first signal line, the block portion, and the block dam on the base substrate.

For example, in a display panel provided by at least one embodiment of the present disclosure, the display panel further includes a passivation layer between the electrode connection portion and the conductive portion, and the encapsulation layer, the electrode structure, the electrode connection portion, and the conductive portion are all in contact with the passivation layer.

For example, in a display panel provided by at least one embodiment of the present disclosure, the first signal line is configured to transmit a cathode signal, and the electrode structure is electrically connected with a cathode of an organic light-emitting diode.

At least one embodiment of the present disclosure further provides a display device, including any one of the display panel as described above.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not restrictive to the present disclosure.

DETAILED DESCRIPTION

Figure 1:
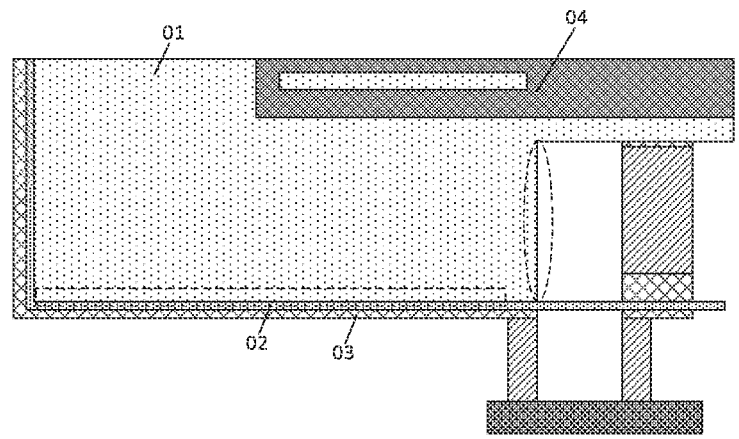
FIG. 1 is a structural plan view of a display panel.

In order to make objectives, technical details, and advantages of the embodiments of the present disclosure more clear, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

For a large-size vehicle-mounted product, because high requirements for a use environment and life of a vehicle-mounted screen, a reliability specification of high temperature and high humidity need to be more than 1200 hours, while a reliability specification of conventional mobile phone panel is more than 200 hours. Therefore, for the large-size vehicle-mounted product, requirements on encapsulation of a flexible display panel is very strict. For example, the flexible display panel usually includes a plurality of pixel units arranged in an array in a display region of a base substrate, a power supply line (generally referred to as a VDD line) for providing a positive power supply signal for each pixel unit, and a power supply line (for example, VSS line) for providing a negative power supply signal to a cathode layer in the display panel. In the case where the VDD line and the VSS line enter an encapsulation region from one side of a driving chip, for example, from a bonding region to a side of a block structure close to the pixel unit, that is, a region near a portion (line entry area) of the block structure where a power supply line passing through, a risk of introducing water and oxygen exists. For medium-size and large-size display products, in order to improve a display uniformity and a long range uniformity (LRU) by reducing the risk of water and oxygen entering into the encapsulation region from outside of the encapsulation region caused by the power supply line, a number of power supply line entering the encapsulation region is usually reduced.

However, in order to further ensure a transmission of an electrical signal of the power supply line, for example, to ensure a stabilized electrical connection between the power supply line (generally referred to as VSS line) that provides the negative power supply signal for the cathode layer in the display panel and the cathode of the organic light-emitting diode, after one end of the VSS line enters the encapsulation region such as enters the block structure, the VSS line needs to be connected with the cathode layer through a transition structure located in the encapsulation region of the base substrate. For example, a transition structure must be added on a source electrode power supply voltage signal line at the lower frame of the display panel to be electrically connected with the cathode. However, inventor(s) of the present disclosure found that although a lap-joint effect of the cathode and the cathode power supply line can be improved by adding the transition structure such as a conductive metal structure, an edge of the conductive metal structure are prone to electrochemical corrosion during a process, and the edge of the conductive metal structure is prone to blackening; therefore, the edge of the conductive metal structure must be protected by an organic material to prevent the edge of the conductive metal structure from being corroded. In addition, adding the block structure can make a printing ink have a certain buffer leveling before reaching the outermost block structure of the display panel, thereby further preventing the printing ink from passing over the outermost block structure of the display panel, so as to improve an encapsulation effect of the display panel.

For example, FIG. 1 is a structural plan view of a display panel. As illustrated in FIG. 1, because a boundary of the conductive metal 01 must be covered by an organic material to prevent electrochemical corrosion, so as to protect the boundary of the conductive metal 01, a film layer of the block structure 02 just includes an organic material, thus the conductive metal 01 can be designed along the edge of the block structure 02 at the edge of the lower frame of the display panel, however, avoiding a phenomenon of poor reliability dark spots for a long time is not considered in this design, once water vapor accumulate in the block structure, the water vapor will follow along the boundary of the conductive metal 01 from the block structure to a cut-off position of the power supply line 03 that provides the negative power signal to enter a side close to a display region 04, that is, in FIG. 1, the water vapor will flow along the boundary of the conductive metal 01 illustrated by a rectangular dashed box in FIG. 1, and then enter the side close to the display region 04 along the boundary of conductive metal 01 illustrated in an oval dashed line, therefore water vapor directly enter the display region 04 along the boundary of the conductive metal 01 because there is no obvious barrier, and the display panel is prone to encapsulation failure in a long-term high temperature and high humidity environment.

The inventor(s) of the present disclosure noticed that the boundary of the conductive metal 01 can be designed to have a stepped shape to extend an intrusion path of water vapor, and the block structure 02 just includes an organic material. The edge of the block structure 02 can further be designed to have a stepped shape along the edge of the conductive metal 01 that has the stepped shape, so as to protect the edge of the conductive metal 01 with the stepped shape to prevent it from being electrochemically corroded. Because the edge of the conductive metal 01 with the stepped shape has obvious corners, which can block water vapor, thereby prolonging the path of water vapor intruding the display region, avoiding the occurrence of phenomenon of the dark spots, and improving the reliability of the display panel. In a conventional block structure, an organic layer includes a two-layer stacked structure. The inventor(s) of the present disclosure further noticed that a thickness of the block structure 02 on the side close to the display region 04 can be reduced, and a thickness of the block structure 02 on the side away from the display region 04 can remains a thickness of the conventional block structure, and because the thickness of the block structure 02 is different, the thickness of the block structure 02 on a side closest to the display region 04 is smaller than the thickness of the block structure 02 on a side farthest from the display region 04, the thickness of the organic layer serving as the water vapor channel is thinned, so that the risk of water vapor accumulation in the organic layer can be reduced. The inventor(s) of the present disclosure further noticed that a width of the organic layer serving as the water vapor channel can be narrowed to facilitate a blocking of water vapor. For example, a width of a currently designed block structure 02 is 40 μm, and the block structure only plays a role in buffering and leveling the printing ink, that is, plays a role in helping the printing ink to level before reaching a real block structure. Therefore, except for the block structure on the side farthest from the display region, the width of the block structure on the side close to the display region can be reduced. For example, the width of the block structure close to the display region can be designed to be less than 40 μm, such as 30 μm, or even smaller, as long as it can be realized that the organic layer included in the block structure can cover the boundary of the metal anode 01.

At least one embodiment of the present disclosure provides a display panel, the display panel includes: a display region and a peripheral region surrounding the display region, the display panel further includes a base substrate, a first signal line, and a covering portion, the first signal line includes an electrode structure in the peripheral region and is located on the base substrate, and an edge of the electrode structure away from the display region (active area, AA) has a stepped shape, and the covering portion covers the edge of the electrode structure away from the display region, so that the edge of the electrode structure away from the display region is protected by the covering portion, so as to reduce a risk of electrochemical corrosion at the edge of the electrode structure away from the display region, and prolong the path of water vapor intruding the display region to prevent water vapor from entering the display region, thereby improving the reliability of the display panel.

Figure 2:
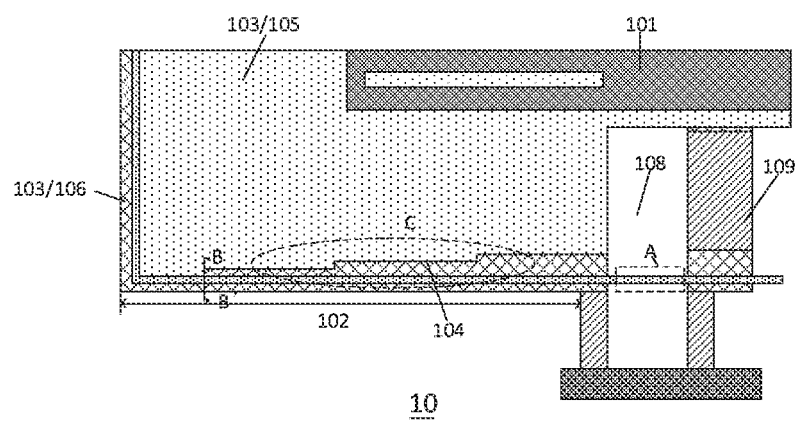
FIG. 2 is a structural plan view of a display panel provided by an embodiment of the present disclosure.

For example, FIG. 2 is a structural plan view of a display panel provided by an embodiment of the present disclosure. As illustrated in FIG. 2, the display panel 10 includes: a display region 101 and a peripheral region 102 surrounding the display region 101, the display panel 10 further includes a first signal line 103 and a covering portion 104 located on the base substrate. The first signal line 103 includes an electrode structure 105 located in the peripheral region 102, and the edge of the electrode structure 105 away from the display region 101 has a stepped shape. For example, the stepped shape is illustrated by an elliptical dotted line C in FIG. 2. The stepped shape of the electrode structure 105 in FIG. 2 can prolong the path of water vapor intruding the display region, so as to avoid the occurrence of the phenomenon of the dark spots and improve the reliability of the display panel.

It should be noted that the edge of the electrode structure 105 away from the display region 101 may be at least one of an edge of a lower frame, an edge of a left frame, an edge of a right frame, and an edge of an upper frame illustrated in FIG. 2, although FIG. 2 illustrates that the edge of the electrode structure 105 is arranged in the stepped shape only at the edge of the lower frame, the embodiments of the present disclosure are not limited thereto, and the edge of the electrode structure 105 in at least one of the left frame, the right frame, and the upper frame away from the display region 101 may also be arranged in the stepped shape.

For example, the display panel 10 includes a plurality of pixel units (not illustrated in the figure), and a region where an orthographic projection of the plurality of pixel units on the base substrate is located corresponds to the display region of the display panel. In the case where the water vapor entering the pixel unit located in the display region, the phenomenon of defect on dark spots is prone to occur.

For example, the electrode structure 105 included in the first signal line 103 is electrically connected with the cathode of the organic light-emitting diode, and the first signal line 103 is configured to transmit a cathode signal.

Figure 3:
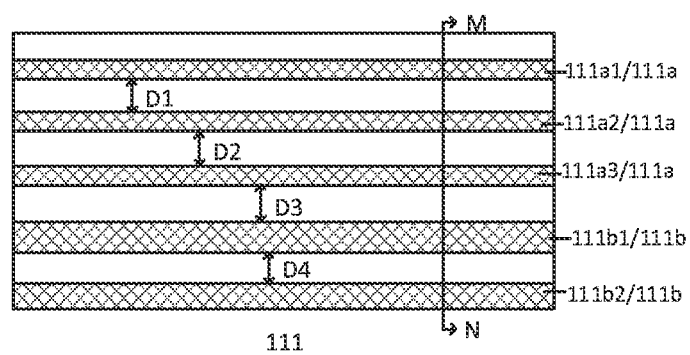
FIG. 3 is a structural plan view of an enlarged region A in FIG. 2.

For example, FIG. 3 is a structural plan view of an enlarged region A in FIG. 2. As illustrated in FIG. 3, the display panel 10 further includes a plurality of block structures 111, and the plurality of block structures 111 are located in the peripheral region 102, and are sequentially arranged along a direction from the peripheral region 102 to the display region 101, each of the plurality of block structures 111 may be arranged around the display region 101, and material of each of the plurality of block structures 111 includes an organic insulating material. For example, each of the block structures 111 may be a ring-shaped structure surrounding a plurality of pixel units for preventing overflow of the organic material that is for inkjet printing and located in a region enclosed by the block structures in the display panel.

For example, as illustrated in FIG. 3, the block structure 111 includes a plurality of block portions 111*a* and a plurality of block dams 111*b* arranged sequentially from a side close to the display region to a side away from the display region, three block portions 111*a* and two block dams 111*b* are illustrated in FIG. 3, but the embodiments of the present disclosure are not limited thereto, and the block structure 111 may have one, two, or more than three block portions 111*a*, and may have one, or more than two block dams 111*b*. In the structure illustrated in FIG. 3, a width of each block portion 111*a* is smaller than a width of each block dam 111*b*.

For example, as illustrated in FIG. 3, the plurality of block portions 111*a* include a first block portion 111*a*1, a second block portion 111*a*2, and a third block portion 111*a*3 arranged sequentially from the side close to the display region to the side away from the display region, the plurality of block dams 111*b* include a first block dam 111*b*1 and a second block dam 111*b*2 arranged sequentially from the side close to the display region to the side away from the display region.

For example, as illustrated in FIG. 3, from the side close to the display region to the side away from the display region, a width of the first block portion 111*a*1, a width of the second block portion 111*a*2, and a width of the third block portion 111*a*3 are equal, and a width of the first block dam 111*b*1 is equal to a width of the second block portion 111*b*2, and the width of each of the plurality of block portions 111*a* is smaller than the width of each of the plurality of block dams 111*b*. It should be noted that the width of each block portion 111*a* refers to a length of each block portion 111*a* along line MN, and the width of each block dam 111*b* refers to a length of each block dam 111*b* along the line MN.

For example, as illustrated in FIG. 3, from the side close to the display region (that is, a side where M is located) to the side away from the display region (that is, a side where N is located), a first distance D1 between the first block portion 111*a*1 and the second block portion 111*a*2 is equal to a second distance D2 between the second block portion 111*a*2 and the third block portion 111*a*3, and is smaller than a third distance D3 between the third block portion 111*a*3 and the first block dam 111*b*1, a fourth distance D4 is between the first block dam 111*b*1 and the second block dam 111*b*2, and the fourth distance D4 is smaller than the first distance D1, because the organic material for inkjet printing flows from the side close to the display region to the side away from the display region, and cannot overflow from the side away from the display region; in order to prevent the organic material for inkjet printing from overflowing from the side away from the display region, the further away from the display region, the smaller the distance between adjacent block structures, that is, the greater the density of the block structure, the lower the risk of the organic material for inkjet printing overflowing from the side away from the display region. Therefore, the fourth distance D4 is arranged to be smaller than the first distance D1, the second distance D2, and the third distance D3 can prevent the organic material for inkjet printing from overflowing from the side away from the display region.

For example, because the materials of the plurality of block structures 111 include organic insulating materials, and at least a part of the plurality of block structures 111 forms the covering portion 104, the covering portion 104 covers a whole or part of the edge of the electrode structure 105 away from the display region, that is, at least two stepped structures included in the stepped shape of the edge of the electrode structure 105 are covered by different block structures 111 to prevent the stepped shape of the edge of the electrode structure 105 from being electrochemically corroded.

Figure 4:
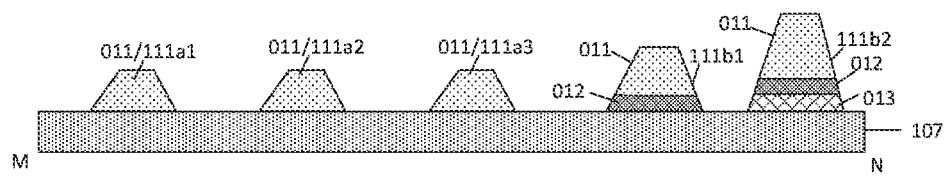
FIG. 4 is a cross-sectional structural view taken along line MN in FIG. 3.

For example, FIG. 4 is a cross-sectional structural view taken along line MN in FIG. 3. As illustrated in FIG. 4, from the side close to the base substrate 107 to the side away from the base substrate 107, a thickness of each block portion 111*a* is smaller than a thickness of each block dam 111*b*. In FIG. 4, a thickness of the first block portion 111*a*1, a thickness of the second block portion 111*a*2, and a thickness of the third block portion 111*a*3 are equal and have a first thickness, the first thickness is smaller than a second thickness of the first block portion 111*b*1, and the second thickness of the first block portion 111*b*1 is smaller than a third thickness of the second block dam 111*b*2, that is, the farther the block structure is away from the display region, the greater the thickness of the block structure, the lower the risk of the organic material for inkjet printing overflowing from the side away from the display region.

It should be noted that the thickness of each block portion or each block dam refers to a vertical distance from a side of each block portion or each block dam away from the base substrate to a side of a corresponding block portion or block dam close to the base substrate.

For example, referring to FIG. 3 and FIG. 4, each of the plurality of block structures 111 may have a thickness of 1 μm~3 μm and a width of 10 μm~40 μm. For example, the block portion 111*a* has a thickness of 1 μm~2 μm and a width of 10 μm~30 μm; the block dam 111*b* has a thickness of 2 μm~3 μm and a width of 30 μm~40 μm. The specific values of the thickness and width of each block portion 111*a* and each block dam 111*b* in the plurality of block structures 111 can be determined according to actual needs, as long as printing ink is prevented from being sprayed to a region outside the outermost block structure 111 in the inkjet printing process.

For example, by arranging the first block dam 111*b*1 and the second block dam 111*b*2, and the thickness of the second block dam 111*b*2 away from the display region is larger than the thickness of the first block dam 111*b*1 close to the display region, it is possible to further prevent overflow of the organic material in the region enclosed by block structure 111. Of course, the block structure 111 may further include more block dams to further prevent the overflow of the organic material, which is not limited in this embodiment of the present disclosure.

For example, as illustrated in FIG. 4, each of the first block portion 111*a*1, the second block portion 111*a*2, the third block portion 111*a*3, the first block dam 111*b*1, and the second block dam 111*b*2 include a first organic layer 011, and the first organic layers 011 of the first block portion 111*a*1, the second block portion 111*a*2, the third block portion 111*a*3, the first block dam 111*b*1, and the second block dam 111*b*2 are arranged in the same layer; each of the first block dam 111*b*1 and the second block dam 111*b*2 further includes a second organic layer 012 arranged on a side of the first organic layer 011 close to the base substrate 107, and the second organic layers 012 of the first block dam 111*b*1 and the second block dam 111*b*2 are arranged in the same layer; the second block dam 111*b*2 further includes a third organic layer 013 arranged on a side of the second organic layer 012 close to the base substrate 107.

For example, the first organic layers 011 included in the first block portion 111*a*1, the second block portion 111*a*2, the third block portion 111*a*3, the first block dam 111*b*1, and the second block dam 111*b*2 are formed in the same process. The second organic layers 012 included in the first block dam 111*b*1 and the second block dam 111*b*2 are formed in the same process. The first block portion 111*a*1, the second block portion 111*a*2, the third block portion 111*a*3, the first block dam 111*b*1, and the second block dam 111*b*2 are all ring structures surrounding a plurality of pixel units in the display region for blocking overflow of organic material in the region enclosed by the block structures in the display panel.

For example, the first block dam 111*b*1 includes the first organic layer 011 and the second organic layer 012 sequentially stacked on the base substrate, and the edge portion of the electrode structure 105 corresponding to the first block dam 111*b*1 is covered by the first organic layer 011.

For example, the first organic layer 011 may be a pixel definition layer (PDL). A material of the first organic layer 011 may include an organic material such as resin, for example, polyimide resin, which is not limited in the embodiment of the present disclosure.

For example, the first organic layer 011 can be formed by means of silk-screen printing, spin coating, inkjet printing, and film casting.

For example, the materials of the second organic layer 012 and the third organic layer 013 may also be an organic material such as polyimide resin, which are not limited in the embodiments of the present disclosure.

Figure 5:
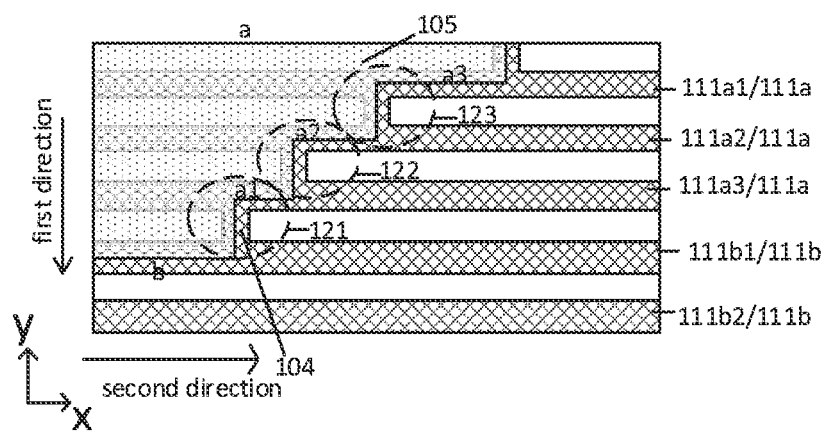
FIG. 5 is an enlarged structural plan view of region C enclosed by dotted ellipse in FIG. 2.

For example, FIG. 5 is a structural plan view of an enlarged region C enclosed by dotted ellipse in FIG. 2, that is, a structural plan view of the electrode structure and the covering portion in FIG. 2. As illustrated in FIG. 5, the edge of the electrode structure 105 away from the display region 101 has a stepped shape, and the covering portion 104 also has a stepped shape, and the covering portion 104 covers the edge of the electrode structure 105 away from the display region 101. Each of the block portions 111a, the first part of the block dam 111b (that is, the first block dam 111b1) and the covering portion 104 are arranged in the same layer, and are of an integral structure, and the second block dam 111b2 and the covering portion 104 have no portion disposed in the same layer, that is, the covering portion 104 does not extend to a region corresponding to the second block dam 111b2.

For example, as illustrated in FIG. 5, an extension direction of at least a part of the covering portion 104 is the same or approximately the same as an extension direction of the edge of the electrode structure 105 away from the display region.

For example, as illustrated in FIG. 5, adjacent block portions 111a are connected by the covering portion 104, the block portion 111a and the first block dam 111b1 are connected by the covering portion 104, or the covering portion 104, the first block portion 111a1, the second block portion 111a2, the third block portion 111a3, and the first block dam 111b1 are of an integral structure.

For example, as illustrated in FIG. 5, a portion of the covering portion 104 between the first block portion 111a1 and the second block portion 111a2 has a first step 121, and a portion of the covering portion 104 between the second block portion 111a2 and the third block portion 111a3 has a second step, and a portion of the covering portion 104 between the third block portion 111a3 and the first block dam 111b1 has a third step 123, and the first step 121, the second step 122, and the third step 123 are connected as a whole to form a stepped shape.

For example, as illustrated in FIG. 5, the electrode structure 105 has a first edge a close to the display region and a second edge b away from the display region, and a direction from the first edge a to the second edge b is a first direction, that is, a direction parallel with the y-axis, a direction intersecting with the first direction is a second direction, that is, a direction parallel with the x-axis, the case where the first direction intersects with the second direction can be that the first direction intersects with or approximately intersects with the second direction, or may also be the case that an angle between the first direction and the second direction is in a range of 0 degree to 30 degrees. In the second direction, a width of the first step 121 is equal to or approximately equal to a width of the second step 122, and is equal to or approximately equal to a width of the third step 123, that is, the first step 121, the second step 122 and the third step 123 are designed with an equal width; or the width of the first step 121 is smaller than the width of the second step 122, and the width of the second step 122 is smaller than the width of the third step 123. FIG. 5 is illustrated with reference to the case where the width a1 of the first step 121 is smaller than the width a2 of the second step 122, and the width a2 of the second step 122 is smaller than the width a3 of the third step 123, by way of example.

It should be noted that "approximately" in the embodiments of the present disclosure refers to an error range that can be allowed to fluctuate within 10% up and down. For example, that the widths are "approximately" equal may be the case where a width deviation between the two widths can be no more than 10%, and for example, the first direction is approximately perpendicular to the second direction may be the case where an angle between the first direction and the second direction can be in a range of 85 degrees and 95 degrees.

For example, the material of the covering portion 104 is an organic material, so that the edge of the electrode structure 105 will not be electrochemically corroded and being blackening, that the covering portion 104 has a stepped shape avoids reducing the reliability of the display panel because the intrusion path of water vapor can be prolonged and it is difficult for water vapor to enter the display region.

For example, in the case where impurities such as external water vapor invade the display panel along the stepped shape of the covering portion 104 (with a concave-convex structure), because the edge of the electrode structure 105 away from the display region has the concave-convex structure, the shape of the intrusion path of the water vapor is similar to the edge shape of the stepped shape. Only after completely passing through the concave-convex structure on each step surface of the electrode structure 105, external water vapor can intrude into an interior of the display region. Compared with a linear path, when impurities such as water vapor invade, this concave-convex structure makes a channel of water vapor unsmooth, which will form a block effect, and can prolong the intrusion path of water vapor, so as to effectively block external substances. Therefore, this structure effectively prolongs the intrusion path of water vapor, provides a good sealing effect, and plays a better role in protecting the display panel.

For example, the concave-convex structures in the stepped shape can have the same shape, the same size, and the same density, or the closer the concave-convex structure is to the display region, the greater the density between the concave-convex structures, that is, the density of the concave-convex structures on the side close to the display region is greater than that of the concave-convex structures on the side away from the display region. In this way, in the case where water vapor invade, the closer the position is to the interior of the display panel, the more difficult it is for water vapor to invade, which ultimately effectively protects the display region of the display panel.

For example, an entirety of the covering portion 104 and the block structure 111 has a plurality of concave-convex structures correspondingly, and may include rectangular groove structures, and a distance between adjacent rectangular groove structures may be the same, when performing an etching process, the process is simple, it is convenient and easy to operate. In one exemplary embodiment, the concave-convex structure may have an arc-shaped edge, and the entirety of the covering portion 104 and the block structure 111 may further include a circular groove structure or a zigzag groove structure correspondingly. The circular groove structure and the zigzag groove structure are the same as the rectangular groove structure in the embodiment of the present disclosure when being arranged. On the plurality of stepped surfaces, shapes of the concave-convex structures may be the same or different, which can be selected according to specific products, so that the encapsulation effect of the display panel is optimal.

For example, when forming the edge of the electrode structure 105 with the concave-convex structure, a photolithography process combined with a halftone mask is used to pattern an electrode structure film formed in a whole layer.

For example, as illustrated in FIG. 5, the covering portion 104 has an integral structure, and the edge of the covering portion 104 illustrated in FIG. 5 has a stepped shape, and the stepped shape is sequentially connected by a plurality of Z-shaped steps, so that the covering portion 104 has an integral structure.

It should be noted that, the shape of Z-shaped step may be a step that is in the shape of a standard Z or a step that is approximately in the shape of Z.

Figure 6:
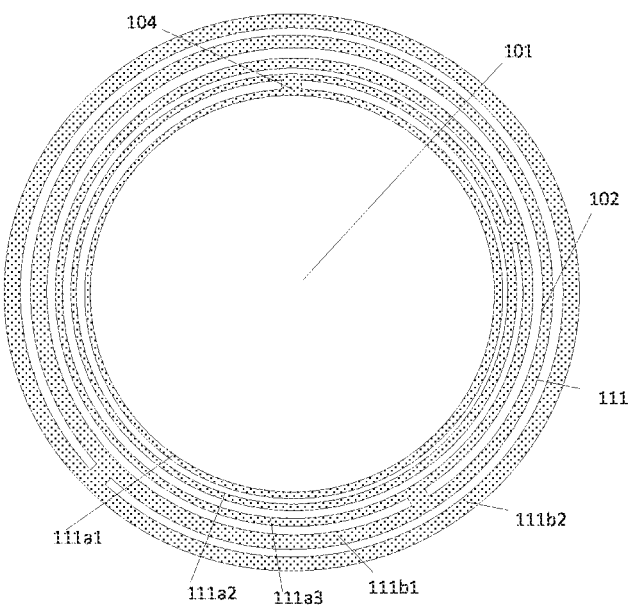
FIG. 6 is a structural plan view of a block structure provided by an embodiment of the present disclosure.

For example, FIG. 6 is a structural plan view of a block structure provided by an embodiment of the present disclosure. As illustrated in FIG. 6, the block structures are sequentially arranged along a direction from the peripheral region 102 to the display region 101, and each of the plurality of block structures 111 may be arranged around the display region 101, and the material of each of the plurality of block structures 111 include organic insulating materials. For example, each of the plurality of block structures 111 may be a ring-shaped structure surrounding a plurality of pixel units for preventing overflow of the organic material that is for inkjet printing and is located in a region enclosed by the block structures in the display panel.

For example, as illustrated in FIG. 6, the block structure 111 includes a plurality of block portions 111a and a plurality of block dams 111b arranged sequentially from the side close to the display region to the side away from the display region. Three block portions 111a and two block dams 111b are illustrated in FIG. 6, but the embodiments of the present disclosure are not limited thereto, and the block structure 111 may have one, two, or more than three block portions 111a, and may have one, or more than two block dams 111b. In the structure illustrated in FIG. 6, the width of each block portion 111a is smaller than the width of each block dam 111b.

For example, as illustrated in FIG. 6, the plurality of block portions 111a include a first block portion 111a1, a second block portion 111a2, and a third block portion 111a3 that are arranged sequentially from the side close to the display region to the side away from the display region, the plurality of block dams 111b include a first block dam 111b1 and a second block dam 111b2 that are arranged sequentially from the side close to the display region to the side away from the display region.

For example, as illustrated in FIG. 6, from the side close to the display region to the side away from the display region, a width of the first block portion 111a1, a width of the second block portion 111a2, and a width of the third block portion 111a3 are equal to each other, and a width of the first block dam 111b1 is equal to a width of the second block dam 111b2, but the width of each of the plurality of block portions 111a is smaller than the width of each of the plurality of block dams 111b.

Figure 7:
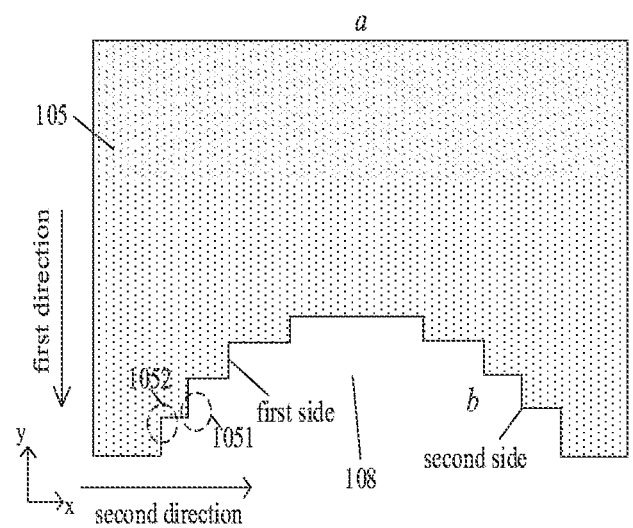
FIG. 7 is a structural plan view of an electrode structure provided by an embodiment of the present disclosure.

The first block portion 111a1, the second block portion 111a2, the third block portion 111a3, the first block dam 111b1, and the second block dam 111b2 are arranged sequentially, and the covering portion 104 is between two adjacent block structures, and the first block portion 111a1, the second block portion 111a2, the third block portion 111a3, the first block dam 111b1, and the second block dam 111b2 are connected by the covering portion 104 to form an integral structure. For example, FIG. 7 is a structural plan view of an electrode structure provided by an embodiment of the present disclosure. As illustrated in FIG. 7, the electrode structure 105 as a whole has a first edge a close to the display region and a second edge b away from the display region, a middle portion of the second edge b is recessed toward the first edge a to form a middle notch 108.

For example, as illustrated in FIG. 7, the second edge b has a stepped shape, that is, has a stepped structure, and the stepped structures are distributed on both sides of the middle notch 108. In one exemplary embodiment, the stepped structures are symmetrical with respect to a enter line of the middle notch 108, that is, axially symmetrical, so that the patterning process of the electrode structure 105 can be conveniently performed, and the patterning process becomes fine, and the embodiments of the present disclosure are not limited thereto.

For example, as illustrated in FIG. 7, on a first side (left side) of the middle notch 108, the width of the electrode structure 105 in the first direction gradually decreases along the second direction b. On a second side (right side) of the middle notch 108, the width of the electrode structure 105 in the first direction gradually increases in the second direction b, thus forming the middle notch recessed toward the first edge a.

For example, as illustrated in FIG. 7, the stepped shape of the electrode structure 105 includes a stepped structure having a first convex structure 1051 and a first concave structure 1052 which are connected with each other and are arranged adjacent to each other, and the first convex structure 1051 and the first concave structure 1052 that are adjacent to each other form a stepped structure.

For example, as illustrated in FIG. 7, the second edge b has Z-shaped steps on both sides of the middle notch 108, the embodiment of the present disclosure is not limited thereto, and the stepped structures on both sides of the middle notch 108 may further be asymmetric. For example, the first side of the middle notch 108 is provided with a Z-shaped step, and the second side of the middle notch 108 is provided with a stepped structure formed by a convex structure with an arc-shaped edge and a concave structure with an arc-shaped edge, that is, a convex portion of the first convex structure 1051 may not have a sharp right angle, but have a smooth arc-shaped edge.

For example, as illustrated in FIG. 7, in the first direction, a size of the middle notch 108 in the second direction increases sequentially, that is, a width of the middle notch 108 in the first direction becomes larger and larger, so that in the second edge b, the electrode structure 105 is provided only at both ends of the second edge b.

For example, referring to FIG. 2 and FIG. 7, the display panel 10 further includes a second signal line 109, and the second signal line 109 is at least partially arranged in the middle notch 108. The first signal line 103 may be connected with a first pin of a chip on film (not illustrated in the figures) to provide a first voltage signal to the chip on film. The second signal line 109 can be connected with a second pin of the chip on film, the first pin and the second pin are insulated from each other, and the second signal line 109 is configured to provide a second voltage signal to the chip on film, the first voltage signal is different from the second voltage signal.

For example, the second signal line 109 is configured to transmit the power signal of a pixel driving circuit. The second signal line 109 is electrically connected with a transistor in the pixel unit of the display panel. For example, the second signal line 109 may be electrically connected with a source electrode or a drain electrode of the transistor in the pixel unit. The second signal line 109 can be used to provide the positive power supply signal for the transistor in the pixel unit, therefore, the second signal line 109 can further be referred to as a VDD power supply line or a VDD line.

Figure 8:
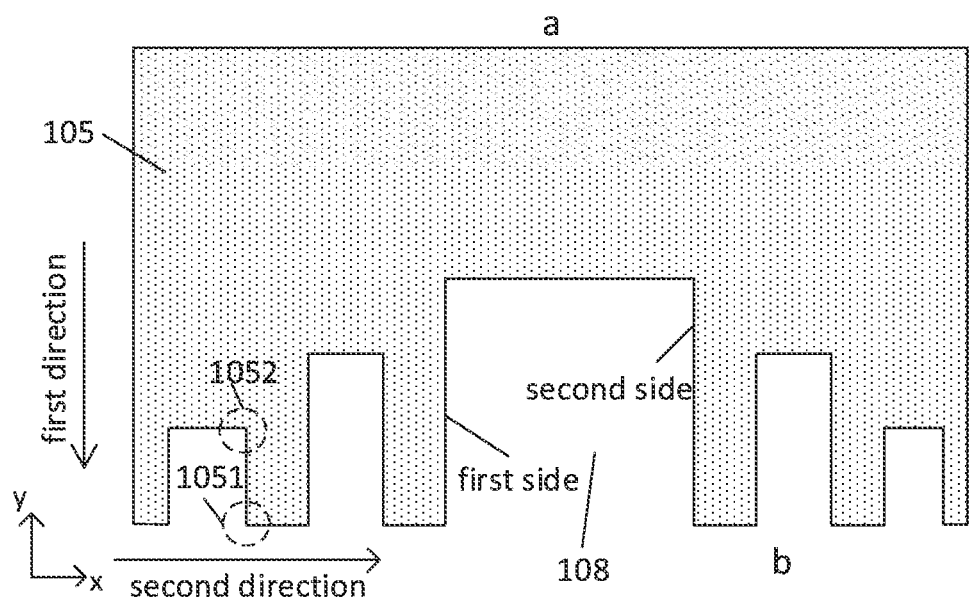
FIG. 8 is a structural plan view of another electrode structure provided by an embodiment of the present disclosure.

For example, FIG. 8 is a structural plan view of another electrode structure provided by an embodiment of the present disclosure. As illustrated in FIG. 8, the electrode structure 105 as a whole has a first edge a close to the display region and a second edge b away from the display region. A middle portion of the second edge b is recessed toward the first edge a to form a middle notch 108, and notches recessed from the second edge b to the first edge a on both sides of the electrode structure 105.

For example, as illustrated in FIG. 8, the second edge b has a stepped shape, that is, has a stepped structure, and the stepped structures are distributed on both sides of the middle notch 108. In one exemplary embodiment, the stepped structures are symmetrical with respect to a center line of the middle notch 108, that is, axially symmetrical, so that the patterning process of the electrode structure 105 can be conveniently performed, and the patterning process becomes fine, and the embodiments of the present disclosure are not limited thereto.

For example, as illustrated in FIG. 8, on the first side (left side) of the middle notch 108, the width of the electrode structure 105 in the first direction firstly decreases, then increases, then decreases and then increases in the second direction b. On the second side (right side) of the middle notch 108, the width of the electrode structure 105 in the first direction firstly decreases, then increases, then decreases and then increases in the second direction b, thus forming a plurality of notches recessed toward the first edge a.

For example, as illustrated in FIG. 8, the stepped shape of the electrode structure 105 includes a stepped structure having a first convex structure 1051 and a first concave structure 1052 which are connected with each other and are arranged adjacent to each other, and the first convex structure 1051 and the first concave structure 1052 that are adjacent to each other form a stepped structure.

For example, as illustrated in FIG. 8, the second edge b has Z-shaped steps on both sides of the middle notch 108, the embodiment of the present disclosure is not limited thereto, and the stepped structures on both sides of the middle notch 108 may further be asymmetric, for example, the first side of the middle notch 108 is provided with a Z-shaped step, and the second side of the middle notch 108 is provided with a stepped structure formed by a convex structure with an arc-shaped edge and a concave structure with an arc-shaped edge, that is, a convex portion of the first convex structure 1051 may not have a sharp right angle, but have a smooth arc-shaped edge.

For example, referring to FIG. 2 and FIG. 8, the display panel 10 further includes a second signal line 109, and the second signal line 109 is at least partially arranged in the middle notch 108. The first signal line 103 may be connected with a first pin of a chip on film (not illustrated in the figures) to provide a first voltage signal to the chip on film. The second signal line 109 can be connected with a second pin of the chip on film, the first pin and the second pin are insulated from each other, and the second signal line 109 is configured to provide a second voltage signal to the chip on film, and the first voltage signal is different from the second voltage signal.

For example, the second signal line 109 is configured to transmit the power signal of a pixel driving circuit. The second signal line 109 is electrically connected with a transistor in the pixel unit of the display panel. For example, the second signal line 109 may be electrically connected with a source electrode or a drain electrode of the transistor in the pixel unit. The second signal line 109 can be used to provide the positive power supply signal for the transistor in the pixel unit, therefore, the second signal line 109 can further be referred to as a VDD power supply line or a VDD line.

Figure 9:
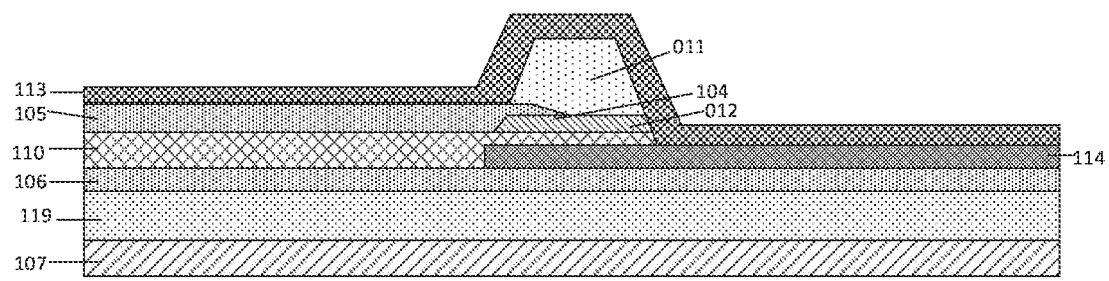
FIG. 9 is a cross-sectional structural view taken along line B-B' in FIG. 2.

For example, FIG. 9 is a cross-sectional structural view taken along line B-B' in FIG. 2. As illustrated in FIG. 2 and FIG. 9, the first signal line 103 further includes a conductive portion 106 located in the peripheral region 102 and arranged on the base substrate 107, the conductive portion 106 and the electrode structure 105 are electrically connected in the peripheral region 102, the conductive portion 106 is closer to the base substrate 107 than the electrode structure 105, the material of the conductive portion 106 and the material of the electrode structure 105 can be the same, which can include silver metal or a mixture of metal silver and indium zinc oxide, or can be a single type of metal, such as silver, aluminum, or metal titanium.

For example, as illustrated in FIG. 9, the first signal line 103 further includes an electrode connection portion 110 located in the peripheral region 102 and arranged between the conductive portion 106 and the electrode structure 105, and the electrode connection portion 110 is in contact with the conductive portion 106, and is in contact with the electrode structure 105, and the electrode structure 105 and the conductive portion 106 are electrically connected through the electrode connection portion 110.

For example, the boundary shape of the electrode connection portion 110 may be the same or approximately the same as the boundary shape of the electrode structure 105, and the boundary shape of the electrode connection portion 110 may be different from that of the electrode structure 105, which is not limited by the embodiments of the present disclosure.

For example, as illustrated in FIG. 9, an orthographic projection of the electrode connection portion 110 on the base substrate 107 overlaps with an orthographic projection of the electrode structure 105 on the base substrate 107, so that the electrode connection portion 110 at least partially overlaps with and at least partially in contact with the electrode structure 105.

For example, as illustrated in FIG. 9, an orthographic projection of the electrode structure 105 on the base substrate 107 is located within an orthographic projection of the electrode connection portion 110 on the base substrate 107, so that the electrode structure 105 and the conductive portion 106 are sufficiently connected by the electrode connection portion 110.

For example, as illustrated in FIG. 9, an orthographic projection of an edge of the electrode connection portion 110 on the base substrate 107 at least partially overlaps with an orthographic projection of the covering portion 104 on the base substrate 107, so that the covering portion 104 can sufficiently cover the electrode connection portion 110 and the electrode structure 105.

For example, the materials of the electrode connection portion 110, the conductive portion 106, and the electrode structure 105 all include conductive metal, the material of the electrode connection portion 110 are same as the material of the conductive portion 106, and the material of the electrode connection portion 110 are different from the material of the electrode structure 105, or, in one exemplary embodiment, the material of the electrode connection portion 110 may also be different from the material of the conductive portion 106.

For example, as illustrated in FIG. 9, the display panel further includes an encapsulation layer 113 disposed a the side of the block portion 111a and the block dam 111b away from the base substrate 107, an orthographic projection of the encapsulation layer 113 covers orthographic projections of the first signal line 103 (including the electrode connection portion 110, the electrode structure 105, and the conductive portion 106), the block portion 111a, and the block dam 111b on the base substrate.

For example, as illustrated in FIG. 9, the display panel 10 further includes a passivation layer 114 located between the electrode connection portion 110 and the conductive portion 106, and the encapsulation layer 113, the electrode structure 105, the electrode connection portion 107, and the conductive portion 106 are all in contact with the passivation layer 114.

For example, the electrode structure 105 is easily corroded by water vapor or oxygen. Therefore, by arranging the passivation layer 114 on the electrode connection portion 107 to cover the electrode connection portion 107, the electrode connection portion 107 will not be corroded by water vapor or oxygen during subsequently forming other film layers, so that the electrode connection portion 107 can stably provide the power supply signal to the conductive portion 106, so as to improve the display effect of the display substrate.

For example, the material of the passivation layer 114 may include at least one selected from the group consisting of silicon nitride (SiNx), silicon oxide (SiOx), silicon oxynitride (SiOxNy), silicon carbide (SiC), aluminum oxide ($Al_2O_3$), zinc sulfide (ZnS), zinc oxide (ZnO), etc., and the material of the passivation layer 114 is not limited in the embodiment of the present disclosure. For example, the passivation layer may be formed by chemical vapor deposition (CVD), sputtering, atomic layer deposition (ALD), etc., and the thickness of the passivation layer may be 0.05 μm~2.5 μm.

It should be noted that, because the first block dam 111b1 is a structure in which the first organic layer 011 and the second organic layer 012 are sequentially stacked on the base substrate, the electrode structure 105 is arranged under the first organic layer 011 included in the first block dam 111b1 to be covered by the first organic layer 011.

Figure 10:
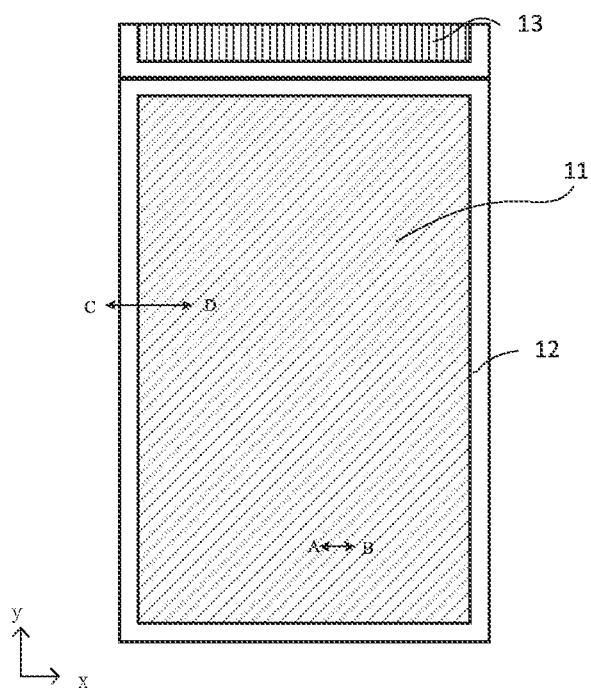
FIG. 10 is a top view of a display panel provided by an embodiment of the present disclosure.

For example, an overall structure of the display panel will be described below with reference to FIG. 10, FIG. 11 and FIG. 12. For example, FIG. 10 is a top view of a display panel provided by an embodiment of the present disclosure, and the display panel is an OLED display panel as an example for illustration. As illustrated in FIG. 10, the OLED display panel includes an encapsulation film covering region (protection region) 11, an unprotected region 12, and a bonding region 13. The unprotected region 12 is not covered by the encapsulation film, the unprotected region 12 may be located at a periphery of the encapsulation film covering region 11, and the bonding region 13 may be disposed on one side of the encapsulation film covering region 11.

Figure 11:
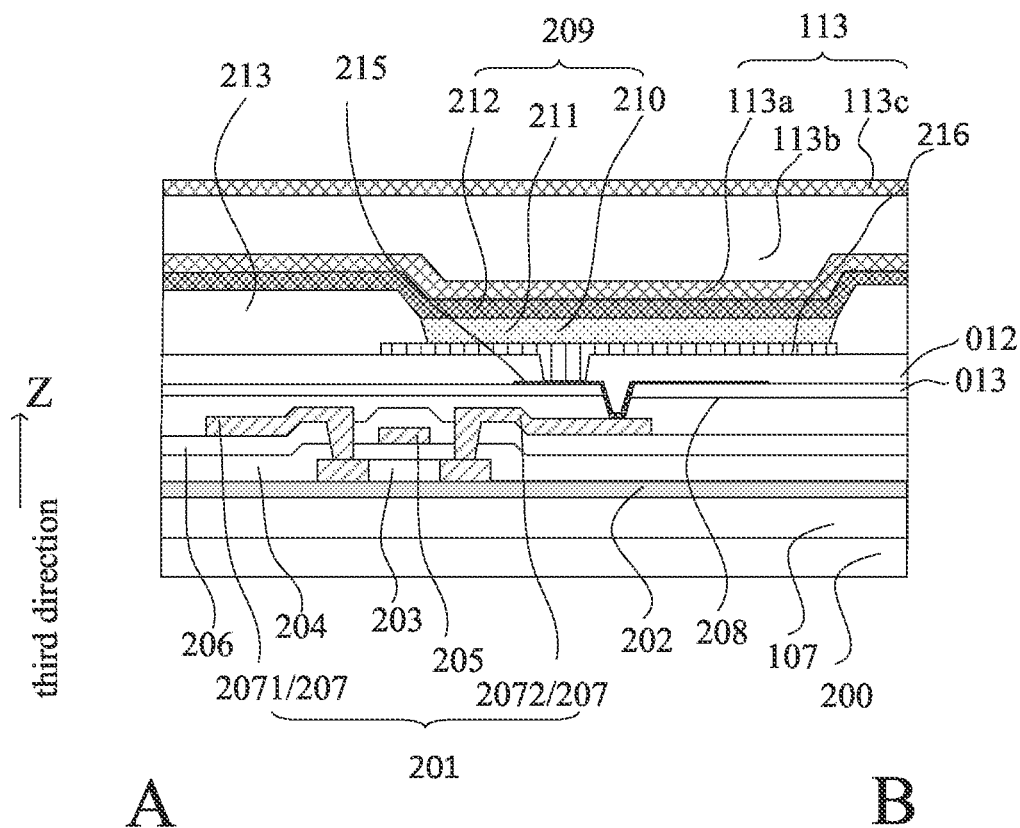
FIG. 11 is a cross-sectional structural view taken along line AB in FIG. 10.

For example, FIG. 11 is a cross-sectional structural view taken along line AB in FIG. 10. In one embodiment, the base substrate 107 is provided on a support substrate 200. The base substrate 107 may be a flexible substrate, such as polyimide (PI), but the embodiments of the present disclosure are not limited thereto. The support substrate 200 may be a glass substrate. For example, in direction Z, an array of thin film transistors 201 (TFT) may be provided on the base substrate 107, the display panel 10 is an organic light-emitting diode display panel, and the organic light-emitting diode display panel includes a thin film transistor 201 and an organic light-emitting diode 209. The thin film transistor 201 includes a source-drain electrode layer 207, the organic light-emitting diode 209 includes a first electrode 210, a connection structure 215 is provided between the source-drain electrode layer 207 and the first electrode 210, and a third electrode 216 is provided between the connection structure 215 and the first electrode 210, a third organic layer 013 is disposed between the source-drain electrode layer 207 and the connection structure 215, and a second organic layer 012 is arranged between the third electrode 216 and the connection structure 215, and the first electrode 210, the third electrode 216, and the connection structure 215 are electrically connected with the source-drain electrode layer 207. With reference to FIG. 2 and FIG. 11, the electrode structure 105 and the first electrode 210 are arranged in the same layer, and the conductive portion 106 and the source-drain electrode layer 207 are arranged in the same layer, and the electrode connection portion 110 and the connection structure 215 are arranged in the same layer. Only one thin film transistor 201 is illustrated in FIG. 11. The thin film transistor 201 may include a semiconductor layer, a gate electrode, a gate insulating layer, a source electrode, and a drain electrode, etc. As illustrated in FIG. 11, a buffer layer 202, a semiconductor layer 203, a gate insulating layer 204, a gate electrode 205, an interlayer dielectric layer 206, and the source-drain electrode layer 207 may be disposed on the base substrate 107 sequentially. The source-drain electrode layer 207 includes a source electrode 2071 and a drain electrode 2072, which are spaced apart from each other and can be connected with the semiconductor layer 203 through via structures, respectively. A planarization layer 208 may be provided on the thin film transistor 201, and a component to be encapsulated (OLED) 209, that is, an organic light-emitting diode, may be provided on the planarization layer 208. The component to be encapsulated (OLED) 209 may include the first electrode 210, a light-emitting functional layer 211, and a second electrode 212, the first electrode 210 can be electrically connected with the drain electrode 2072 through a via hole penetrating the planarization layer 208. A pixel defining layer 213 may be disposed on the first electrode 210 to facilitate a formation of the light-emitting functional layer 211. The second electrode 212 may be electrically connected with an electrode lead line (not illustrated in the figure) through the electrode structure 105. The light-emitting functional layer 211 may include a light-emitting layer, and may further include other functional layers, for example, may further include at least one selected from the group consisting of a hole injection layer, a hole transport layer, an electron transport layer, and an electron injection layer, but the embodiments of the present disclosure are not limited thereto. For example, the electrode lead line may be formed in the same layer as the source-drain electrode layer 207. An encapsulation layer 113 may be formed on the device to be encapsulated (OLED) 209. The encapsulation layer 113 covers the device to be encapsulated 209. The structure of the component to be encapsulated (OLED) 209 is not limited thereto.

FIG. 7, FIG. 8 and FIG. 10 illustrate a first direction Y and a second direction X, and FIG. 11 illustrates a third direction Z. For example, in an embodiment of the present disclosure, the first direction Y and the second direction X are directions parallel with a main surface of the base substrate, and the third direction Z is a direction perpendicular to the main surface of the base substrate. The main surface of the base substrate is a surface on which various elements are formed. An upper surface of the base substrate in FIG. 11 is the main surface of the base substrate. For example, the first direction Y intersects with the second direction X. For further example, the first direction Y is perpendicular to the second direction X.

Figure 12:
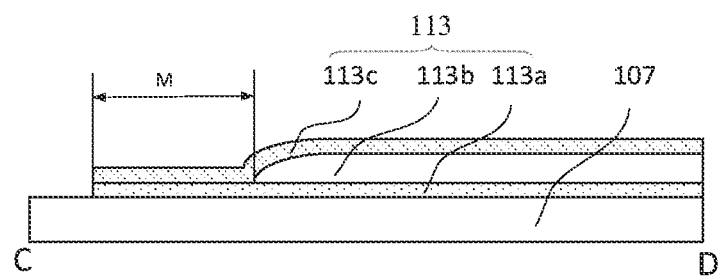
FIG. 12 is a cross-sectional structural view taken along line CD in FIG. 10.

For example, FIG. 12 is a cross-sectional structural view taken along line CD in FIG. 10. As illustrated in FIG. 12, the encapsulation layer 113 is disposed on the base substrate 107, and the encapsulation layer 113 includes a first thin film 113a, a second thin film 113b, and a third thin film 113c that are away from the base substrate 107 sequentially, the second thin film 113b is sandwiched between the first thin film 113a and the third thin film 113c, and at an edge position, the first thin film 113a and the third thin film 113c are in contact with each other, FIG. 12 illustrates a stacked-contact portion M (stacked-contact position) of the first thin film 113a and the third thin film 113c. For example, the first thin film 113a and the third thin film 113c can be thin films formed of an organic material, for example, the organic material can be one or more inorganic oxides or inorganic nitrides such as SiNx, SiOx, SiCxNy, the embodiments of the present disclosure are not limited thereto. For example, the second thin film 113b may be a film formed of an organic material, for example, the organic material may be an organic substance such as a resin, but the embodiments of the present disclosure are not limited thereto. The resin may be, for example, a thermosetting resin, and the thermosetting resin, for example, includes epoxy resin, but the embodiments of the present disclosure are not limited thereto. The resin may be, for example, a thermoplastic resin, and the thermoplastic resin includes, for example, acrylic (PMMA) resin, but the embodiments of the present disclosure are not limited thereto. For example, the first thin film 113a and the third thin film 113c can be prepared by a chemical vapor deposition (CVD) method, and the second thin film 113b can be prepared by an ink jet printing (IJP) method. Both the first thin film 113a and the third thin film 113c may serve as a water block layer. For example, the first thin film 113a may include a plurality of sub-layers that are arranged in a stacked manner, and the second thin film 113b and the third thin film 113c may further include a plurality of sub-layers that are arranged in a stacked manner, so as to prevent external water and oxygen from entering inside of the display panel.

Referring to FIG. 11 and FIG. 12, the encapsulation layer 113 is located on a side of the electrode structure 105 away from the base substrate 107, and the overlap portion of the second thin film 113b and the third thin film 113c of the encapsulation layer 113 can cover the block structure 111. The boundary of the region covered by the encapsulation layer 113 may be located on a side of the block structure 111 away from the plurality of pixel units.

It should be noted that the second thin film 113b may be located within the region enclosed by the block structure 111, and the first thin film 113a and the third thin film 113c may cover the region enclosed by the block structure 111 and cover the block structure 111. That is, an orthographic projection of the block structure 111 on the base substrate 107 is located in the region covered by the encapsulation layer 113, so that the encapsulation layer 113 can effectively encapsulate the structures located in the region enclosed by the block structure 111.

Figure 13:
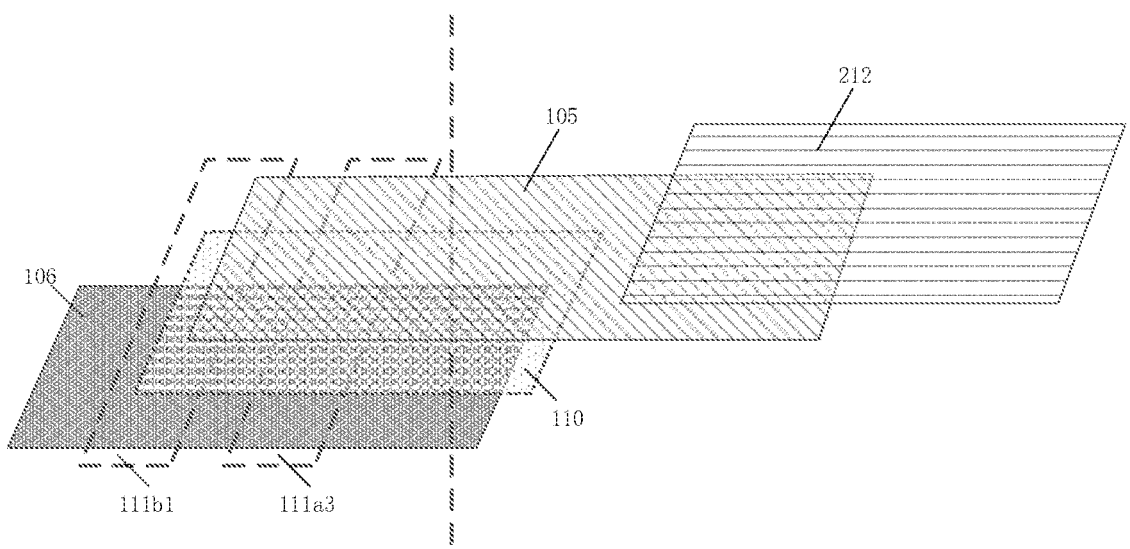
FIG. 13 is a disassembled view of a display panel provided by an embodiment of the present disclosure.

For example, FIG. 13 is a disassembled view of a display panel provided by an embodiment of the present disclosure. As illustrated in FIG. 13, a part of the electrode structure 105 extends to partially overlap with the electrode connection portion 110, and another part of the electrode structure 105 extends to overlap with the second electrode 212 to realize lap-joint to the second electrode 212, and the second electrode 212 is, for example, the cathode of the organic light-emitting diode. An orthographic projection of the electrode structure 105 on the base substrate overlaps with the third block portion 111a3 (the first block portion and the second block portion are not illustrated in FIG. 11), and overlaps with a portion of the first block dam 111b1, that is, one end of the electrode structure 105 extends to the region corresponding to the first block dam 111b1.

For example, at least one embodiment of the present disclosure further provides a display device, and the display device may include the display panel in any of the above-mentioned embodiments. The display device can be a foldable display device, for example, can be: liquid crystal panel, electronic paper, organic light-emitting diode (OLED) panel, active-matrix organic light-emitting diode (AMOLED) panel, mobile phone, tablet computer, TV, monitor, notebook computer, digital photo frame, navigator and any other product or component with display function.

The display panel provided by at least one embodiment of the present disclosure has at least one of the following technical effects:

(1) In the display panel provided by at least one embodiment of the present disclosure, a covering portion is provided to cover the edge of the electrode structure away from the display region, so that the edge of the electrode structure is protected, and the phenomenon of electrochemical corrosion of the edge of the electrode structure is avoided, and by arranging the edge of the electrode structure away from the display region to have a stepped shape, the path for water vapor to enter the display region is prolonged, therefore it is difficult for water vapor to enter the display region, thereby avoiding the occurrence of dark spots and improving the reliability of the display panel.

(2) In the display panel provided by at least one embodiment of the present disclosure, the thickness of the block structure on the side closest to the display region is arranged to be smaller than the thickness of the block structure on the side farthest away from the display region, thereby the thickness of the organic layer serving as water vapor channel is reduced, and the risk of water vapor accumulation in the organic layer is reduced.

(3) In the display panel provided by at least one embodiment of the present disclosure, the width of the block structure on the side close to the display region is reduced, thereby enhancing the ability of the block structure for blocking water vapor.

The following points need to be explained.

(1) The drawings of the embodiments of the present disclosure only relates to the structures involved in the embodiments of the present disclosure, other structures can refer to conventional design.

(2) For the sake of clarity, in the drawings used to describe the embodiments of the present disclosure, the thickness of a layer or region is enlarged or contracted, that is, these figures are not drawn according to actual scale.

(3) In the case of no conflict, the features in the same embodiment and different embodiments of the present disclosure can be combined with each other.

The above are only specific embodiments of the present disclosure, but the protection scope of the present disclosure is not limited thereto. The protection scope of the present disclosure should be subject to the protection scope of the claims.

What is claimed is:

1. A display panel, comprising:
a display region;
a peripheral region surrounding the display region;
a base substrate;
a first signal line, located on the base substrate, comprising an electrode structure located in the peripheral region, and in a plan view of the display panel, an edge of the electrode structure away from the display region having a stepped shape; and
a covering portion, covering the edge of the electrode structure away from the display region.

2. A display panel, comprising:
a display region;
a peripheral region surrounding the display region;
a base substrate;
a first signal line, located on the base substrate, comprising an electrode structure located in the peripheral region, and an edge of the electrode structure away from the display region having a stepped shape; and
a covering portion, covering the edge of the electrode structure away from the display region,
wherein the first signal line further comprises a conductive portion located in the peripheral region and arranged on the base substrate, the conductive portion and the electrode structure are electrically connected in the peripheral region, and the conductive portion is closer to the base substrate than the electrode structure.

3. The display panel according to claim 2, wherein the covering portion has a stepped shape.

4. The display panel according to claim 2, wherein the electrode structure has a first edge close to the display region and a second edge away from the display region, and a middle portion of the second edge is recessed toward the first edge to form a middle notch, and the second edge has a stepped structure.

5. The display panel according to claim 4, wherein a direction from the first edge to the second edge is a first direction, a direction intersecting with the first direction is a second direction, and on a first side of the middle notch, a width of the electrode structure in the first direction gradually decreases along the second direction; on a second side of the middle notch, a width of the electrode structure in the first direction gradually increases along the second direction.

6. The display panel according to claim 4, wherein the stepped shape comprises a first convex structure and a first concave structure which are connected with each other and arranged adjacent to each other.

7. The display panel according to claim 5, wherein along the first direction, a size of the middle notch in the second direction increases sequentially.

8. The display panel according to claim 5, further comprising a second signal line, wherein at least a part of the second signal line is arranged in the middle notch.

9. The display panel according to claim 5, wherein the first signal line further comprises an electrode connection portion located in the peripheral region and disposed between the conductive portion and the electrode structure, the electrode connection portion is in contact with the conductive portion and is in contact with the electrode structure.

10. The display panel according to claim 9, wherein an orthographic projection of the electrode connection portion on the base substrate overlaps with an orthographic projection of the electrode structure on the base substrate.

11. The display panel according to claim 9, wherein an orthographic projection of the edge of the electrode connection portion on the base substrate at least partially overlaps with an orthographic projection of the covering portion on the base substrate.

12. The display panel according to claim 9, further comprising a plurality of block structures, materials of the plurality of block structures comprise an organic insulating material, and at least a part of the plurality of block structures forms the covering portion, at least two stepped structures are covered by different block structures.

13. The display panel according to claim 12, wherein the plurality of the block structures are located in the peripheral region, and are sequentially arranged along a direction from the peripheral region to the display region, and each of the block structures is arranged around the display region.

14. The display panel according to claim 12, wherein the block structure comprises a block portion and a block dam, wherein the block portion and the block dam are arranged sequentially along the first direction, and from a side close to the base substrate to a side away from the base substrate, a thickness of the block portion is smaller than a thickness of the block dam.

15. The display panel according to claim 14, further comprising an encapsulation layer arranged on a side of the block portion and the block dam away from the base substrate, an orthographic projection of the encapsulation layer overlaps with an orthographic projection of at least a part of the first signal line, the block portion, and the block dam on the base substrate,
the display panel further comprises a passivation layer between the electrode connection portion and the conductive portion, wherein the encapsulation layer, the electrode structure, the electrode connection portion, and the conductive portion are all in contact with the passivation layer.

16. The display panel according to claim 14, wherein the block portion, a first part of the block dam, and the covering portion are arranged in the same layer and have an integral structure.

17. The display panel according to claim 14, wherein the block portion comprises a first block portion, a second block portion, and a third block portion that are sequentially arranged along the first direction, and the block dam comprises a first block dam and a second block dam that are arranged sequentially along the first direction,
along the first direction, a first distance D1 between the first block portion and the second block portion is substantially equal to a second distance D2 between the second block portion and the third block portion, and is smaller than a third distance D3 between the third block portion and the first block dam.

18. The display panel according to claim 17, wherein
a portion of the covering portion between the first block portion and the second block portion has a first step;
a portion of the covering portion between the second block portion and the third block portion has a second step; and
a portion of the covering portion between the third block portion and the first block dam has a third step,
in the second direction, a width of the first step is equal to or approximately equal to a width of the second step, and is equal to or approximately equal to a width of the third step.

19. The display panel according to claim 17, wherein from a side close to the base substrate to a side away from the base substrate, a thickness of the first block portion, a thickness of the second block portion, and a thickness of the third block portion are equal and each of which is a first thickness, the first block dam has a second thickness, the second block dam has a third thickness, and the first thickness, the second thickness, and the third thickness increases sequentially.

20. A display device, comprising the display panel according to claim 2.

* * * * *